US012699126B2

(12) United States Patent
Zhuang et al.

(10) Patent No.: US 12,699,126 B2
(45) Date of Patent: Aug. 4, 2026

(54) SEMICONDUCTOR TEST KEY STRUCTURE AND TEST METHOD OF SEMICONDUCTOR STRUCTURE

(71) Applicant: United Semiconductor (Xiamen) Co., Ltd., Xiamen (CN)

(72) Inventors: Ya Xuan Zhuang, Shamen City (CN); Wei-Chun Chang, Taichung City (TW); You-Di Jhang, New Taipei City (TW); Chin-Chun Huang, Hsinchu County (TW); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 167 days.

(21) Appl. No.: 18/777,495

(22) Filed: Jul. 18, 2024

(65) Prior Publication Data

US 2026/0002974 A1     Jan. 1, 2026

(30) Foreign Application Priority Data

Jun. 26, 2024    (CN) ......................... 202410840238.9

(51) Int. Cl.
*G01R 31/26*          (2020.01)
*G01R 3/00*           (2006.01)

*H10P 74/00*          (2026.01)
*H10P 74/20*          (2026.01)

(52) U.S. Cl.
CPC ........... *G01R 31/2601* (2013.01); *G01R 3/00* (2013.01); *H10P 74/207* (2026.01); *H10P 74/273* (2026.01)

(58) Field of Classification Search
USPC ..................................................... 324/762.01
See application file for complete search history.

(56) References Cited

U.S. PATENT DOCUMENTS

| | | |
|---|---|---|
| 8,536,709 B1 | 9/2013 | Hsu |
| 8,754,504 B2 | 6/2014 | Hsu |
| 8,776,363 B2 | 7/2014 | Hsu |
| 8,921,901 B1 | 12/2014 | Kao |
| 9,224,696 B2 | 12/2015 | Li |
| 2020/0243416 A1* | 7/2020 | Chen .................... H10P 74/277 |

* cited by examiner

*Primary Examiner* — Farhana A Hoque
(74) *Attorney, Agent, or Firm* — Winston Hsu

(57) ABSTRACT

The invention provides a semiconductor test key structure, which comprises a substrate, a plurality of gate structures located on the substrate, a plurality of thin film resistor layers, wherein each thin film resistor layer is located above one of the gate structures, and the thin film resistor layers are located in a dielectric layer, a test key circuit layer is located on the dielectric layer, wherein the test key circuit layer is a square wave pattern from a top view, and two contact pads are respectively connected with the test key circuit layer.

16 Claims, 5 Drawing Sheets

SEMICONDUCTOR TEST KEY STRUCTURE AND TEST METHOD OF SEMICONDUCTOR STRUCTURE

BACKGROUND OF THE INVENTION

1. Field of the Invention

The invention relates to the field of semiconductor manufacturing, in particular to a semiconductor test key structure and a test method thereof. It can be used to test the semiconductor structure containing the thin film resistance layer, and can be used to judge whether the thin film resistance layer will be burned under high electric field.

2. Description of the Prior Art

In current semiconductor industry, metal-oxide-semiconductor field-effect transistors (MOSFET) mostly use polysilicon material to make their gate. However, polysilicon materials still have many disadvantages: compared with most metal materials, polysilicon gates have higher resistance, so the conductivity of polysilicon gates is lower than that of metal wires. In order to make up for this shortcoming, polysilicon gate needs to be treated with metal silicide to reduce contact resistance and parasitic resistance (Rp) at the same time, and improve its operating speed to an acceptable range.

With the semiconductor manufacturing trend of replacing the traditional polysilicon gate with metal gate, the passive devices made of polysilicon materials in the past can also be replaced by metal materials. Similar to the semiconductor manufacturing technology experienced by active devices, passive devices such as thin film resistors can be combined with active devices, for example, in the process of transistor manufacturing, various passive devices can be formed by photolithography, etching and other methods.

Take the combination structure of thin film resistor and transistor as an example. As the size of semiconductor is getting smaller and smaller, the distance between various components is getting smaller and smaller too. When the elements are closely arranged, it is easy to cause various electrical problems, for example, adjacent elements may easily have electrical interaction, and even when applied to high voltage elements, the strong electric field generated by high voltage may cause damage to adjacent elements.

SUMMARY OF THE INVENTION

The invention provides a semiconductor test key structure, which is characterized by comprising a substrate, a plurality of gate structures located on the substrate, a plurality of thin-film resistor layers, wherein each thin-film resistor layer is located above one of the gate structures, and the thin-film resistor layers are located in a dielectric layer, a test key circuit layer located on the dielectric layer, wherein the test key circuit layer is a wave pattern when viewed from a top view, and two contact pads are respectively connected.

The invention also provides a method for testing a semiconductor test key structure, which is characterized by comprising the following steps: providing a substrate, forming a plurality of gate structures on the substrate, and forming a plurality of thin film resistor layers, wherein each thin film resistor layer is located above one of the plurality of gate structures, and the plurality of thin film resistor layers are located in a dielectric layer, forming a test key circuit layer on the dielectric layer, wherein the test key circuit layer is a square wave pattern from a top view, forming two contact pads, respectively connecting the two ends of the test key circuit layer, applying a voltage to the two contact pads, and gradually increasing the voltage, and observing whether the thin film resistor layer generates a burning phenomenon.

The invention is characterized in that due to miniaturization of electronic components, various electronic components are arranged more closely in a limited space. In some structures, a high voltage device region (including electronic components suitable for high voltage disposed within), a medium voltage device region (including electronic components suitable for medium voltage disposed within) and a low voltage device region (including electronic components suitable for low voltage disposed within) may be arranged adjacent to each other, and in order to effectively use space, a thin-film resistance layer is often formed above the transistor, that is, the thin-film resistance layer is inserted between the transistor and the first conductive layer (i.e., the first lateral conductive layer above the transistor). In the current technology, the distance between the thin film resistor layer and the first conductive layer may be small (about 500 angstroms), and when the first conductive layer is electrified, it will generate an electric field, and due to the electric field coupling and electric field breakdown effect, the electric field may penetrate through the dielectric layer and affect the thin film resistor layer below, even when the electric field intensity is high, it will cause the damage of the thin film resistor. Therefore, in the embodiment of the present invention, a test key structure is proposed, in which a low voltage device region, a medium voltage device region and a high voltage device region in a semiconductor device are arranged adjacent to each other, wherein each region is provided with a transistor and a thin film resistor layer, and then a test key circuit layer is designed above the thin film resistor layer. The test key circuit layer can be designed as a square wave shape to improve the arrangement density and increase the generated electric field to control and simulate the actual electric field. The invention can test the voltage tolerance of the underlying thin film resistor layer by applying voltage to the test key circuit layer, and then adjust the layout parameters of the semiconductor structure, such as appropriate circuit distribution density and dielectric layer thickness. Therefore, the test key structure and test method of the invention contribute to the yield and quality of the semiconductor structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

In order to make the following easier to understand, readers can refer to the drawings and their detailed descriptions at the same time when reading the present invention. Through the specific embodiments in the present specification and referring to the corresponding drawings, the specific embodiments of the present invention will be explained in detail, and the working principle of the specific embodiments of the present invention will be expounded. In addition, for the sake of clarity, the features in the drawings may not be drawn to the actual scale, so the dimensions of some features in some drawings may be deliberately enlarged or reduced.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Although the present invention uses the terms first, second, third, etc. to describe elements, components, regions, layers, and/or sections, it should be understood that such elements, components, regions, layers, and/or sections should not be limited by such terms. These terms are only used to distinguish one element, component, region, layer and/or block from another element, component, region, layer and/or block. They do not imply or represent any previous ordinal number of the element, nor do they represent the arrangement order of one element and another element, or the order of manufacturing methods. Therefore, the first element, component, region, layer or block discussed below can also be referred to as the second element, component, region, layer or block without departing from the specific embodiments of the present invention.

The term "about" or "substantially" mentioned in the present invention usually means within 20% of a given value or range, such as within 10%, or within 5%, or within 3%, or within 2%, or within 1%, or within 0.5%. It should be noted that the quantity provided in the specification is approximate, that is, the meaning of "about" or "substantially" can still be implied without specifying "about" or "substantially".

The terms "coupling" and "electrical connection" mentioned in the present invention include any direct and indirect means of electrical connection. For example, if the first component is described as being coupled to the second component, it means that the first component can be directly electrically connected to the second component, or indirectly electrically connected to the second component through other devices or connecting means.

Although the invention of the present invention is described below by specific embodiments, the inventive principles of the present invention can also be applied to other embodiments. In addition, in order not to obscure the spirit of the present invention, specific details are omitted, and the omitted details are within the knowledge of those with ordinary knowledge in the technical field.

Figure 1:
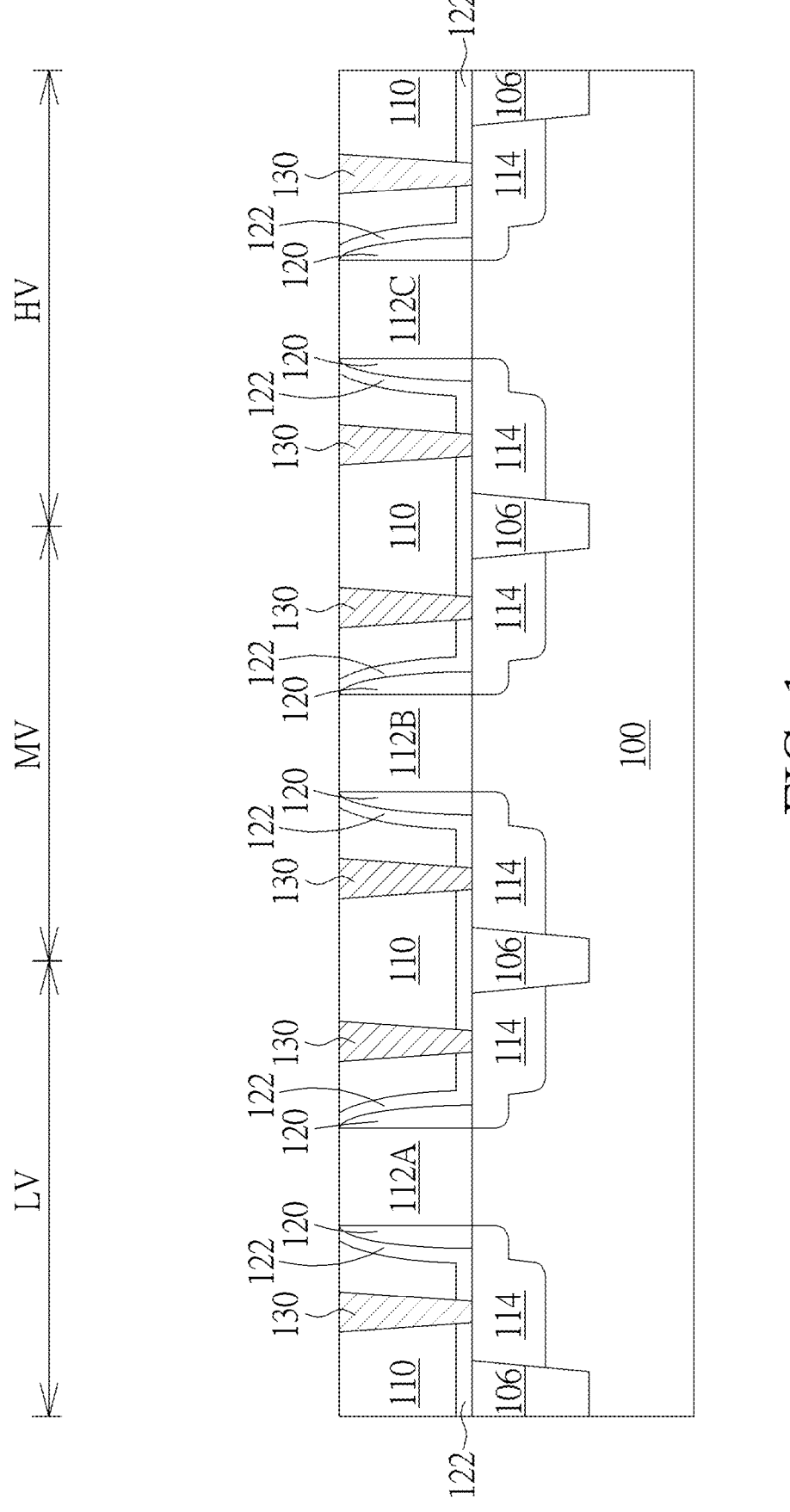
FIGS. 1 to 2 are schematic cross-sectional views of a semiconductor structure.
Figure 2:
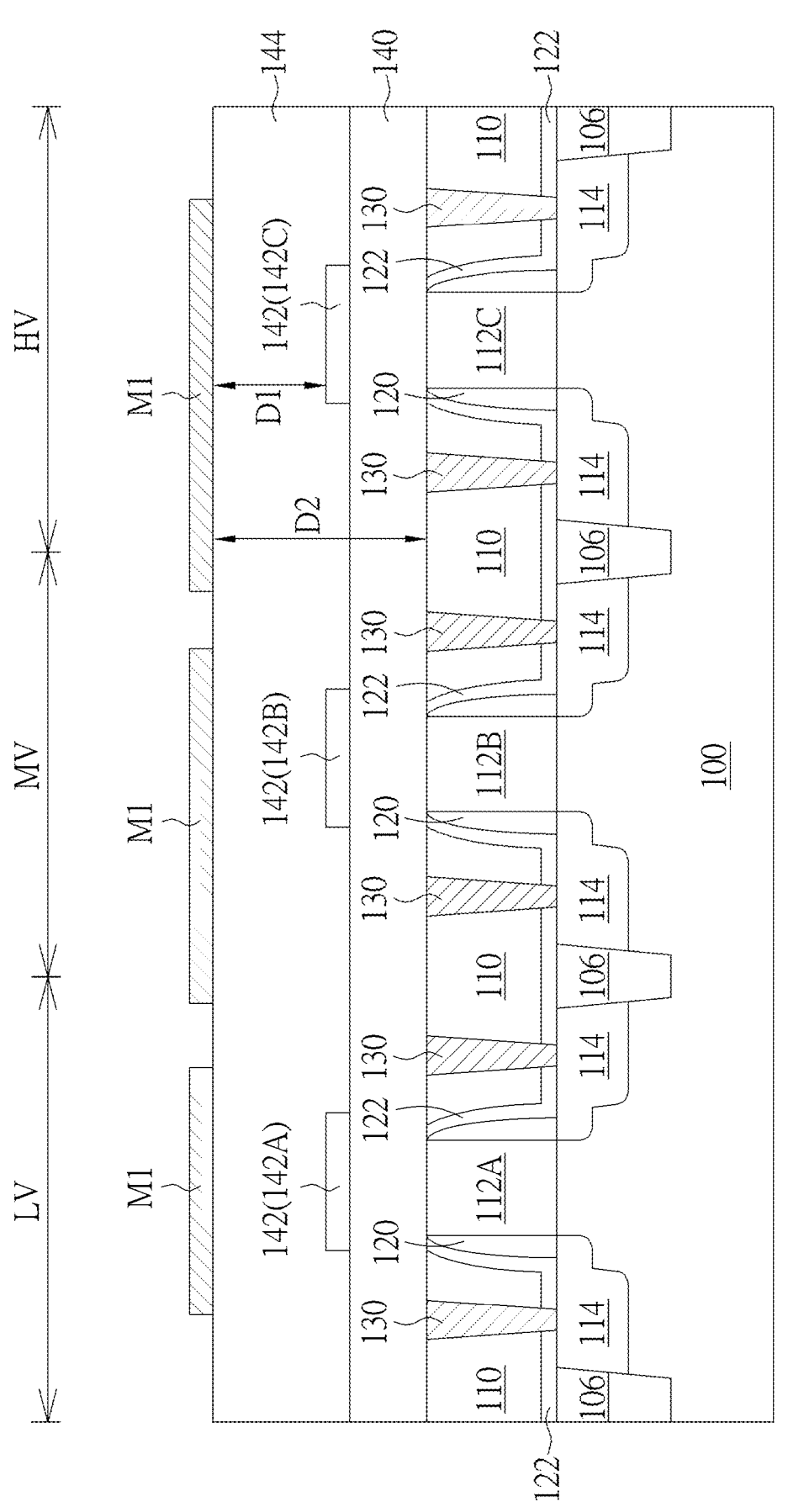

FIGS. 1 to 2 are schematic cross-sectional views of a semiconductor structure. As shown in FIG. 1, the test key structure 1 of the present invention comprises a substrate 100, on which a low voltage device region LV, a medium voltage device region MV and a high voltage device region HV are defined, and then a plurality of shallow trench isolation, STI 106 for providing electrical insulation in different regions are formed in the substrate 100 of the test key structure 1. The substrate 100 can be various semiconductor substrates, such as a silicon substrate, an epitaxial silicon substrate, a silicon germanium substrate, a silicon carbide substrate or a silicon-on-insulator (SOI) substrate. As for the low voltage device region LV, the medium voltage device region MV and the high voltage device region HV described here, electronic elements suitable for corresponding voltages will be formed in the following steps. More specifically, the elements in the low voltage device region of the present invention are suitable for low voltage electronic elements, such as transistors with operating voltages below 1 volt, such as CMOS (complementary metal oxide semiconductor). The devices in the medium voltage device region are suitable for medium voltage electronic devices, such as transistors with operating voltages ranging from 1 volt to 10 volts, such as power transistors. The devices in the high voltage device region are suitable for high voltage electronic devices, such as transistors with operating voltage above 10 volts, such as IGBT (insulated gate bipolar transistor) and MOSFET (metal oxide semiconductor field effect transistor). However, the above transistors are just some examples of the present invention, and the present invention is not limited to this.

Referring to FIG. 1, a low voltage gate structure 112A, a medium voltage gate structure 112B and a high voltage gate structure 112C are respectively formed in the low voltage device region LV, the medium voltage device region MV and the high voltage device region HV. From the process point of view, the low voltage gate structure 112A, the medium voltage gate structure 112B and the high voltage gate structure 112C can be polysilicon gates or metal gates. Taking the polysilicon gate as an example, respective polysilicon gates can be formed in a patterned manner in the low voltage device region LV, the medium voltage device region MV and the high voltage device region HV, and then processes such as lightly doped drain (LDD), spacers, source/drain, dielectric layer deposition and polishing can be performed.

Or in other embodiments, the low voltage gate structure 112A, the medium voltage gate structure 112B and the high voltage gate structure 112C are metal gates. For example, the metal gates can be formed by a metal gate replacement (RMG) process. For example, a polysilicon gate (not shown) can be formed as a dummy gate in the low voltage device region LV, the medium voltage device region MV and the high voltage device region HV respectively, and after the lightly doped drain (LDD), spacers, source/drain, dielectric layer deposition and other processes are completed, the polysilicon gate can be replaced by a metal gate. Then, a plurality of first contacts 130 are formed in the interlayer dielectric layer 110.

In the above embodiment, if the gate structure is a metal gate, it may include a high dielectric constant dielectric layer and a metal material layer, wherein the high dielectric constant layer is arranged between the substrate and the metal material layer, which can be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZrxTi_1$-$xO_3$, PZT), barium strontium titanate ($BaxSr_1$-$xTiO_3$, BST) or a combination thereof. The metal material layer can be adjusted depending on whether it is an N-type metal-oxide semiconductor (NMOS) gate structure or a P-type metal-oxide semiconductor (PMOS) gate structure, and it can have a corresponding bottom barrier layer, a work function metal layer, a top barrier layer and a main conductive layer.

The material of the first contact 130 is, for example, aluminum (Al), tungsten (W), copper (Cu), titanium aluminide (TiAl), titanium (Ti), tantalum (Ta), titanium nitride (TiN), tantalum nitride (TaN) or titanium aluminum oxide (TiAlO), etc.

In addition, a plurality of spacers 120 of single-layer or multi-layer composite structures made of silicon nitride or silicon oxide, and a plurality of doped regions 114 are formed in the substrate 100 on at least one side of the low voltage gate structure 112A, the medium voltage gate structure 112B and the high voltage gate structure 112C. The doped region 114 includes a conventional LDD (lightly doped drain) region and a source/drain region, and may further include an epitaxial layer, such as a silicon germanium epitaxial layer or a silicon carbide epitaxial layer, and a metal silicide layer (not shown) may be formed on the surface of the doped region 114, but it is not limited thereto. In addition, a contact etch stop layer, CESL 122 may be further included between the substrate 100 and the interlayer dielectric layer 110.

Up to now, as shown in FIG. 1, the low voltage device region LV, the medium voltage device region MV and the high voltage device region HV in this embodiment respectively include a low voltage gate structure 112A, a medium voltage gate structure 112B and a high voltage gate structure 112C, wherein their respective top surfaces are flush with the top surface of the interlayer dielectric layer 110, and the top surface of each first contact 130 is also flush with the top surface of the interlayer dielectric layer 110, and the shape of each first contact 130 is not limited, and it may include post contacts or slot contacts.

As mentioned above, the low voltage gate structure 112A, the medium voltage gate structure 112B and the high voltage gate structure 112C are suitable for different operating voltages, and they belong to different types of transistors, so their detailed structures may be different. Here, in order to simplify the drawing, the detailed structures of the low voltage gate structure 112A, the medium voltage gate structure 112B and the high voltage gate structure 112C are not clearly drawn, but those skilled in the art should understand that these transistors suitable for different operating voltages may contain different structures and materials, so they are not detailed here.

Then, a dielectric layer and thin film resistor layers are formed over the low voltage gate structure 112A, the medium voltage gate structure 112B and the high voltage gate structure 112C. As shown in FIG. 2, a dielectric layer 140 is formed over the low voltage gate structures 112A, the medium voltage gate structures 112B and the high voltage gate structures 112C in the low voltage device region LV, in the medium voltage device region MV and in the high voltage device region HV, and then patterned thin film resistor layers 142 are formed in the low voltage device region LV, in the medium voltage device region MV and in the high voltage device region HV, respectively. Here, for convenience of distinction, The thin film resistor layer in the low voltage device region LV is defined as a low voltage thin film resistor layer 142A, the thin film resistor layer in the medium voltage device region MV is defined as a medium voltage thin film resistor layer 142B, and the thin film resistor layer in the high voltage device region HV is defined as a high voltage thin film resistor layer 142C. Then another dielectric layer 144 is formed to cover the thin film resistor layers 142, and a planarization step (such as chemical mechanical polishing) is performed to flatten the surface of the dielectric layer 144. The dielectric layer 140 and the dielectric layer 144 described here are, for example, silicon oxide, silicon nitride, silicon oxynitride or other suitable materials, such as PSG (phosphosilicate glass) and USG (undoped silicate glass). The thin film resistor layer 142 can be made of barrier materials such as titanium nitride or tantalum nitride. In this embodiment, a dielectric layer 140 with a certain thickness is formed first, then the patterned thin film resistor layers 142 are formed, and then a dielectric layer 144 is formed. Therefore, the thin film resistor layers 142 are located between the dielectric layer 140 and the dielectric layer 144, and each thin film resistor layer 142 is located above the gate structure of the transistor (such as the low voltage gate structure 112A, the medium voltage gate structure 112B and the high voltage gate structure 112C).

In some semiconductor devices, it is necessary to integrate passive components (such as thin film resistors) with active components (such as transistors). As the size of the semiconductor device is gradually shrinking, the space can be effectively utilized by arranging the thin film resistor layer 142 directly above the transistor. That is to say, there is no need to use other space to accommodate the thin film resistor layer. Next, a first conductive layer M1 is formed above the dielectric layer 144, wherein the material of the first conductive layer M1 is, for example, metal, such as tungsten, cobalt, copper, aluminum, gold, silver, etc. The first conductive layer M1 is used to connect various electronic components below, including transistors, resistors and other electronic components above.

In the above configuration, the thin film resistor layer 142 is inserted between the first conductive layer M1 and the gates of transistors (the low voltage gate structure 112A, the medium voltage gate structure 112B and the high voltage gate structure 112C). Although the space can be saved, there are some hidden disadvantages in this configuration, that is, the distance between the first conductive layer M1 and the thin film resistor layers 142 is short, which may affect the electrical properties. For example, the vertical distance between the first conductive layer M1 and the thin film resistor layers 142 is defined as D1, and the distance between the bottom surface of the dielectric layer 140 and the top surface of the dielectric layer 144 (that is, the sum of the thicknesses of the dielectric layer 140 and the dielectric layer 144) is defined as D2. In this embodiment, D1 is about 500 angstroms and D2 is about 1200 angstroms. In other words, since the thin film resistor layers 142 are arranged between the dielectric layer 140 and the dielectric layer 144, the thin film resistor layers 142 are closer to the first conductive layer M1.

As mentioned above, since the semiconductor structure of the present invention integrates the high voltage element, the medium voltage element and the low voltage element, high voltage (or high current) may pass through the first conductive layer M1. When high voltage electricity passes through the first conductive layer M1, a strong electric field will be formed around the first conductive layer M1. When the dielectric layer is thin (for example, the distance D1 from the thin film resistor layer 142 is about 500 angstroms), the strong electric field generated in the first conductive layer M1 may penetrate through the dielectric layer 144 and affect the thin film resistor layer 142 below according to the electric field coupling effect and the electric field breakdown effect. This will cause the thin film resistor layer 142 to generate an induced electric field, and raise the temperature of the thin film resistance layer 142, and even burn the thin film resistor layer 142 in more serious cases.

There are some ways to solve the problem that the thin film resistor layer is burnt down due to the strong induced electric field. Firstly, the voltage applied to the first conductive layer M1 can be reduced, and then the generated electric field intensity is reduced. Secondly, the thin film resistor layer 142 can be set further away from the first conductive layer M1, or the thickness of the dielectric layer 144 can be increased. However, as mentioned above, the present invention is applicable to a semiconductor structure which is closely arranged and contains integrated components with different applied voltages. Therefore, the voltage applied to the first conductive layer M1 cannot be reduced, otherwise some high voltage elements cannot be driven. In addition, setting the thin film resistor layer 142 in other regions instead of directly above the gate can solve the problem, but at the same time it is not conducive to the miniaturization of the device (because other space should be allocated to accommodate the thin film resistor layers). Therefore, the remaining method is to increase the thickness of the dielectric layer 144 between the thin film resistor layers 142 and the first conductive layer M1. However, if the thickness of the dielectric layer 144 is excessively increased, the space will be wasted, which is not conducive to the miniaturization of devices. However, if the thickness of the dielectric layer 144 is insufficient, the above-mentioned thin film resistor layers will be burned due to the strong induced electric field. In addition, in practical application, the density of the first conductive layer M1 will also affect the intensity of the electric field generated by the first conductive layer M1, so the high density of the first conductive layer M1 may also increase the probability of the above-mentioned thin film resistor layer burning.

In terms of manufacturing process, since both the transistor and the first conductive layer M1 belong to the lower structure in the semiconductor stacked structure, that is to say, the manufacturing and formation time of these devices is earlier, and there may be a multi-layer structures continuously formed above the first conductive layer M1. If the test process to determine whether the thin film resistor layers 142 will burn is carried out after the product is completed, it will not be conducive to the overall process.

Therefore, the present invention provides a semiconductor test key structure, or a test key structure. Characterized in that after the thin film resistor layers and the dielectric layer are completed, the electric field formed by the first conductive layer is simulated by a test key structure, so as to test whether the thin film resistor layer in each region will be burned or not under the condition of generating high electric field density, so that the highest tolerable voltage value can be determined and the process parameters can be adjusted at the early stage of the process, which is beneficial to improving the process efficiency of the semiconductor.

Figure 3:
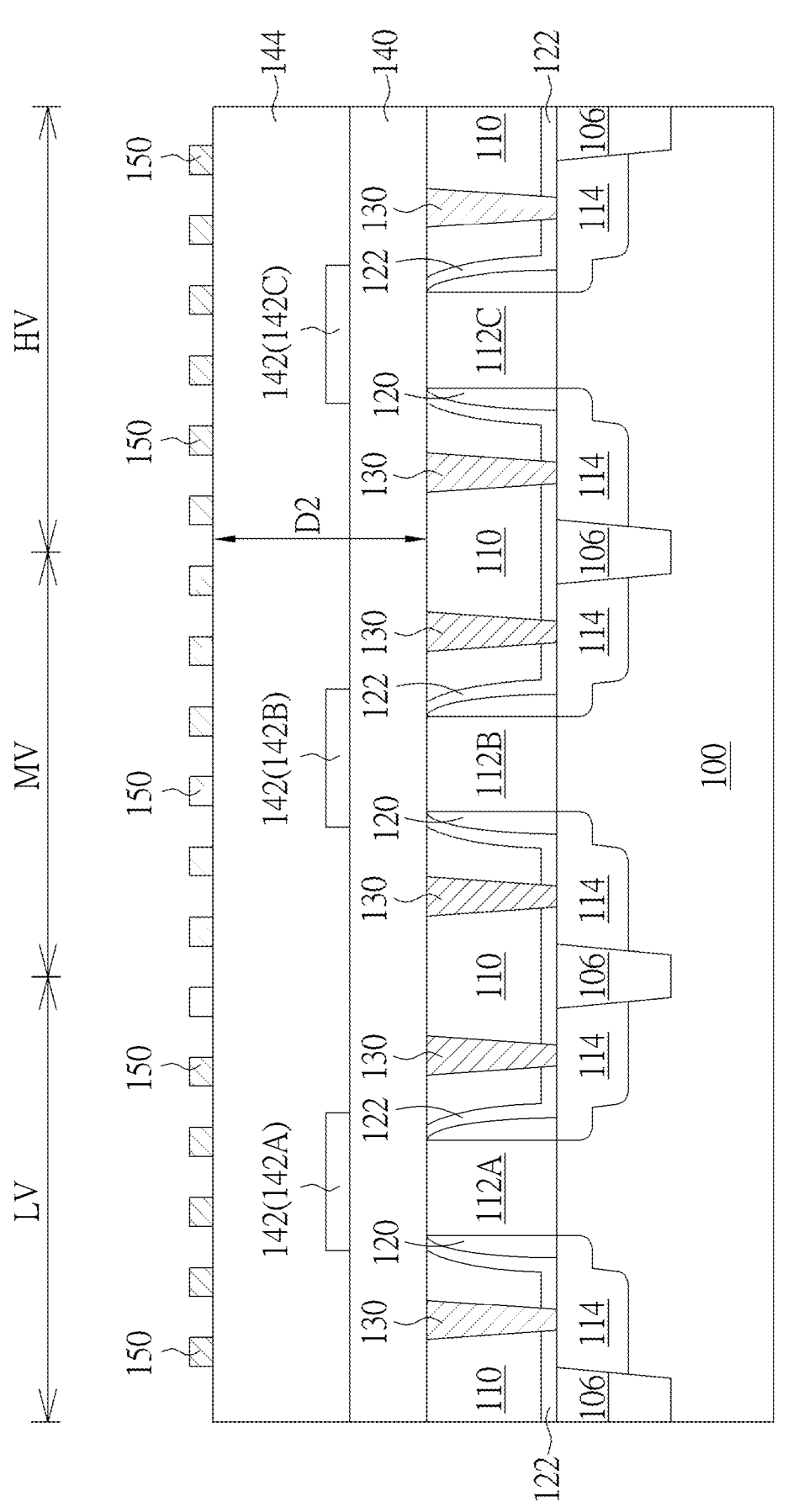
FIG. 3 shows a schematic cross-sectional structure of a semiconductor including a test key structure according to an embodiment of the present invention.
Figure 4:
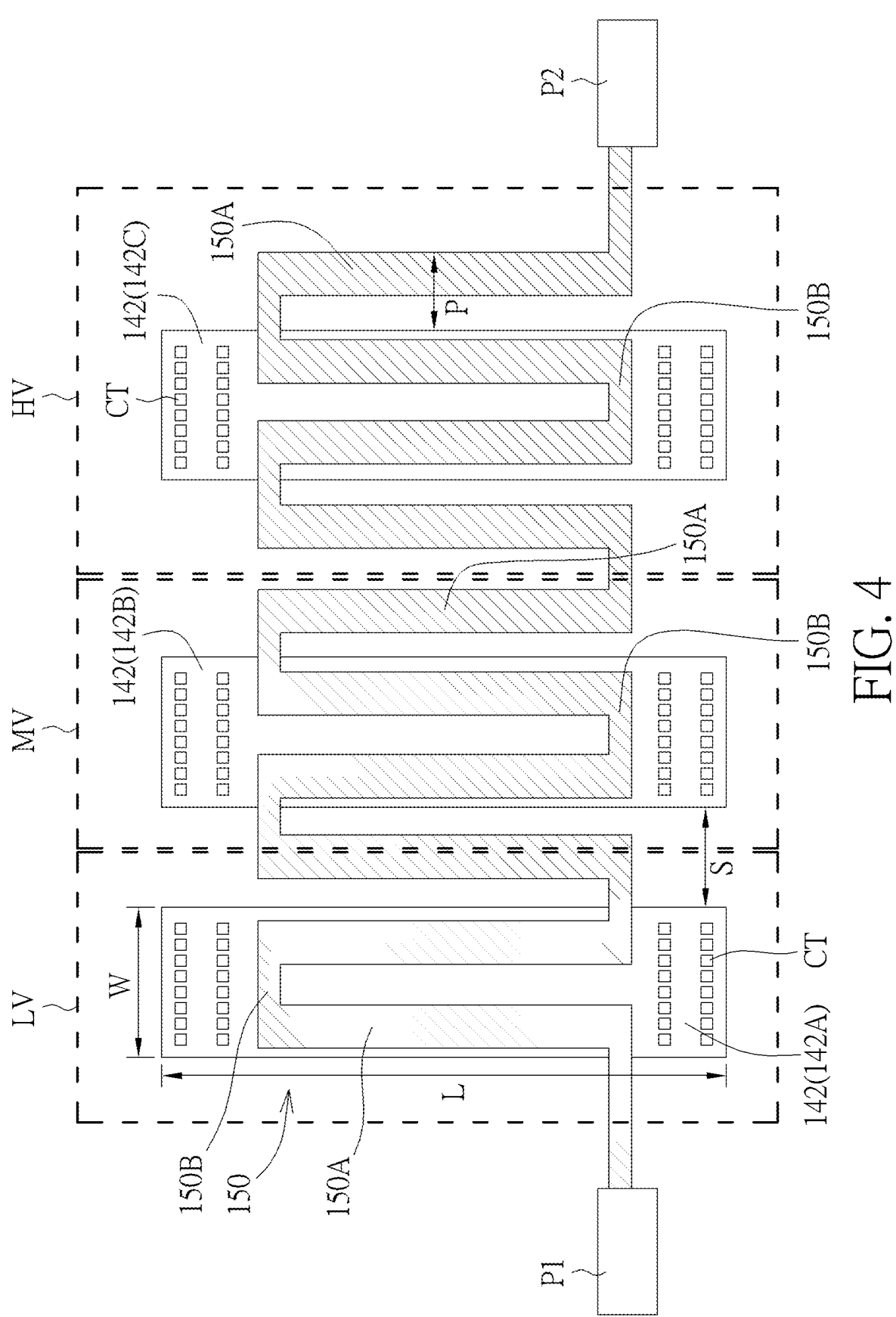
FIG. 4 is a schematic diagram showing the top view of the test key circuit layer and the thin film resistance layer.

It is worth noting that the semiconductor structure shown in FIG. 2 above is formed in a device region, that is, the main region of the semiconductor element. Generally, the semiconductor device additionally includes a peripheral region or a test region (sometimes the scribe line is used as the test region), and a test key structure can be formed in the peripheral region to test the performance of the semiconductor device. Please refer to FIG. 3 and FIG. 4. FIG. 3 shows a schematic cross-sectional structure of a semiconductor including a test key structure according to an embodiment of the present invention, and FIG. 4 shows a schematic top view of a test key circuit layer and a thin film resistor layer. Most of the structures shown in FIG. 3 are the same as those shown in the above-mentioned FIG. 2, so the same element structures are not repeated here. The main difference in the structure of this embodiment is that the semiconductor structure shown in FIG. 2 is formed in the peripheral region, that is, the devices including the transistors, the thin film resistor layers 142, the dielectric layer 140 and the dielectric layer 144, and then the first conductive layer M1 is formed on the dielectric layer 144 in the device region, and a test key circuit layer 150 can be formed on the dielectric layer 144 in the peripheral region. FIG. 3 shows a cross-sectional view of a semiconductor structure including a test key circuit layer in the peripheral region, wherein the position of the test key circuit layer 150 is the same as that of the first conductive layer M1, but from the top view, the shape of the test key circuit layer 150 is preferably arranged in a square wave shape, and the so-called square wave shape here can also be called a rectangular wave shape. The test key circuit layer 150 includes a plurality of strip patterns 150A and a plurality of connection patterns 150B, wherein each strip pattern 150A includes two ends, namely a head end and a tail end, and the strip patterns 150A are arranged in parallel along a first direction (e.g. Y axis direction), while each connection pattern 150B is arranged along a second direction (e.g. X axis direction), wherein the first direction and the second direction are preferably perpendicular to each other, but not limited to this. Then, the connection patterns 150B connect the head ends of two adjacent strip patterns 150A, or the tail ends of two adjacent strip patterns 150A, and the connection patterns 150B are alternately arranged, that is, if any connection pattern 150B connects the tail ends of two adjacent strip patterns 150A, the left and right two adjacent connection patterns of the connection pattern 150B connect the head ends of two adjacent strip patterns 150A. On the other hand, from the X direction, if any connection pattern 150B connects the head ends of two adjacent strip patterns 150A, the two adjacent connection patterns on the left and right sides of the connection pattern 150B connect the tail ends of two adjacent strip patterns 150A.

The test key circuit layer 150 is designed as a square wave shape or a rectangular wave shape as shown in FIG. 4, so that the test key circuit layer 150 is a continuous pattern. Conduct pads P1 and P2 are respectively connected at both ends of the test key circuit layer. Voltage can be applied from the conductive pad P1 and the conductive pad P2 to gradually increase the electric field intensity generated by the test key circuit layer 150. In addition, in this embodiment, the length and width of each strip pattern 150A, the length and width of each connection pattern 150B and the spacing between adjacent strip patterns 150A of the test key circuit layer 150 can be adjusted as required. Taking this embodiment as an example, the distance in the X direction from a right side of any strip pattern 150A to a right side of another adjacent strip pattern 150A is P, where the distance P is preferably greater than 100 nm, and any other thin film resistor layer 142 is rectangular, and a long side (length) L of the thin film resistor layer 142 along the Y direction is greater than 640 nm, and a short side (width) W along the X direction is greater than 100 nm. While adjusting the above parameters, the pattern density of the test key circuit layer 150 can also be changed, where the pattern density refers to the ratio of the area of the test key circuit layer to the total area of the region, and the pattern density can be controlled by increasing or decreasing the area occupied by the test key circuit layer 150. Preferably, the pattern density of the test key circuit layer 150 can be designed to be close to the pattern density of the first conductive layer M1 which is scheduled to be formed later, so as to simulate the electric field of the first conductive layer M1 more accurately.

In addition, the test key circuit layer 150 in this embodiment spans three regions, namely, the low voltage device region LV, the medium voltage device region MV and the high voltage device region HV, which means that the test key circuit layer 150 can simultaneously simulate the reactions of the thin film resistor layers 142 in three different regions after being subjected to the induced electric field. From the top view, each thin film resistor layer 142 is connected with a contact structure CT, and a fixed current can be passed through the contact structure CT at the upper and lower ends and the current value can be observed, so as to calculate the resistance value of the thin film resistor layer.

Besides, in some embodiments of the present invention, the test key circuit layer 150 may be designed according to the pattern density of the first conductive layer M1 which is scheduled to be formed later, or the test key circuit layer 150 may be designed to have different pattern densities in different regions. For example, if the pattern density of the first conductive layer M1 scheduled to be formed later is relatively high in the low voltage device region LV and relatively low in the high voltage device region HV, the test key circuit layer 150 can be designed accordingly, for example, the square wave shaped patterns in the low voltage device region LV can be arranged more densely or the square wave shaped patterns in the high voltage device region HV can be arranged more loosely. It is also within the scope of the present invention to make the pattern density of the test key circuit layer 150 higher in the low voltage device region LV or lower in the high voltage device region HV, so as to approach the pattern density of the first conductive layer M1 and further make the result of the simulated electric field more accurate.

Figure 5:
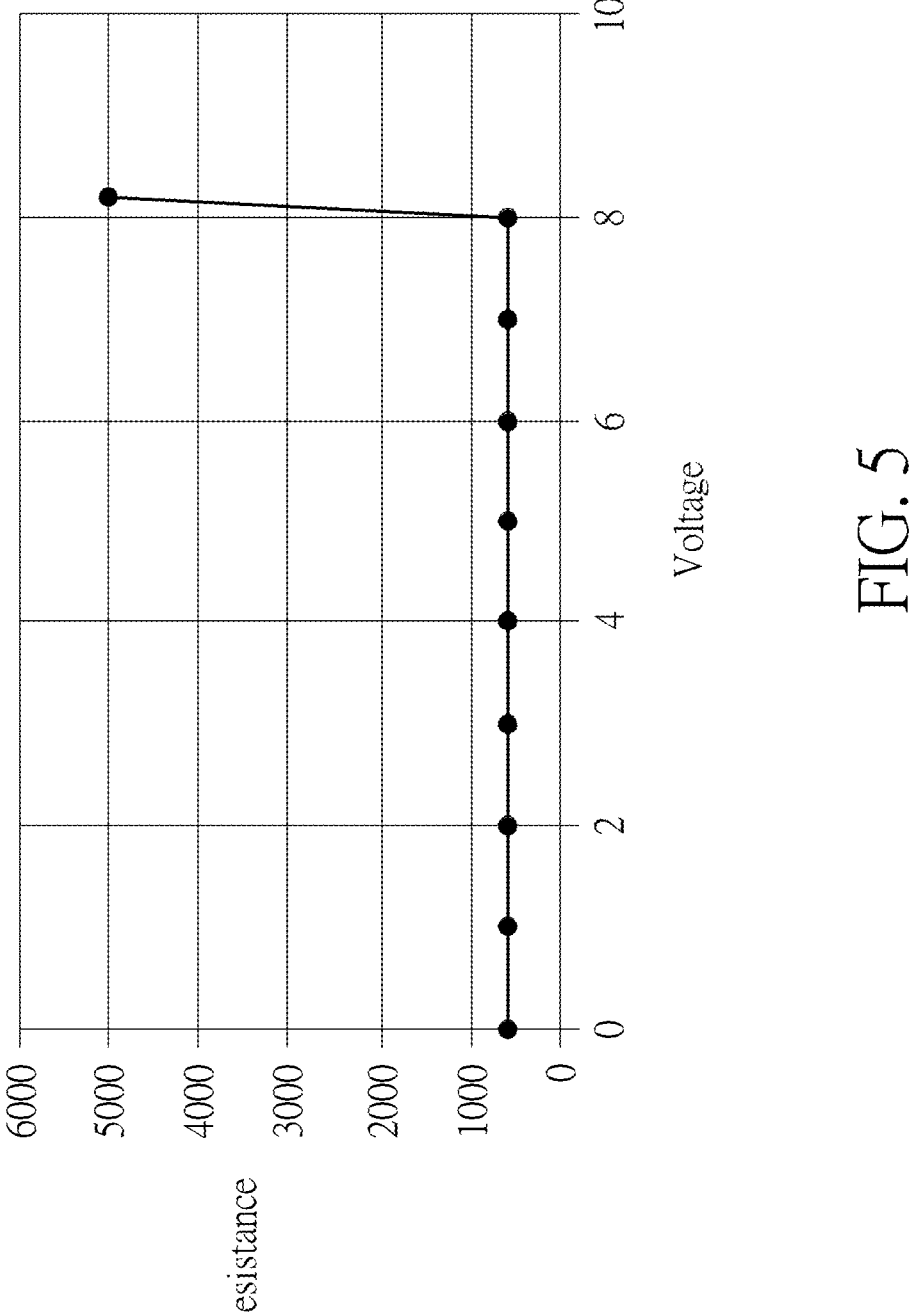
FIG. 5 shows a voltage-resistance diagram obtained from a test process.

The semiconductor test key structure shown in FIGS. 3 and 4 can be used to simulate the current flowing through the first conductive layer M1 (here, the test key circuit layer 150) and generate an electric field, and to test whether the underlying thin film resistor layer 142 will be burned under the high electric field. In an example, the voltage applied to the test key circuit layer 150 can be gradually increased, and the change of the resistance value of the thin film resistor layer 142 can be observed. FIG. 5 shows a voltage-resistance diagram obtained from a test process. Wherein the horizontal axis is the voltage applied to the test key circuit layer 150, and the vertical axis is the resistance value of the thin film resistor layer 142. The thin film resistor layer 142 tested here may be any one of the low voltage thin film resistor layer 142A in the low voltage device region LV, the medium voltage thin film resistor layer 142B in the medium voltage device region MV or the high voltage thin film resistor layer 142C in the high voltage device region HV. From FIG. 5, it can be found that when the applied test key circuit layer 150 is increased to a certain extent (about 8 volts from FIG. 5, but the present invention is not limited to this), the resistance value of the thin film resistor layer 142 will rapidly increase. This situation usually means that the thin film resistor layer has been burned and an open circuit has been formed, so the measured resistance value will be much higher than the normal value. In this way, the maximum voltage tolerance of the low voltage thin film resistor layer 142A, the medium voltage thin film resistor layer 142B and the high voltage thin film resistor layer 142C can be determined under this line pattern density.

After the test key structure is completed, the producer can judge whether it is necessary to adjust the process parameters according to the test results, such as increasing the thickness of the dielectric layer between the circuit layer and the thin film resistor layer, or adjusting the pattern density of the circuit layer, so as to avoid the burning of the thin film resistor layer. Therefore, the invention has the advantage that the electric field induction of the thin film resistor layer can be tested at the early stage of the process, and the results can be adjusted. It is beneficial to improve the productivity and quality of the whole semiconductor.

Based on the above description and drawings, a semiconductor test key structure of the present invention, please refer to FIGS. 3 and 4, includes a substrate 100, a plurality of gate structures (the low voltage gate structure 112A, the medium voltage gate structure 112B and the high voltage gate structure 112C) located on the substrate 100, and a plurality of thin film resistor layers 142, each of the thin film resistor layers is located above one of the plurality of gates. A plurality of thin film resistor layers 142 are located in a dielectric layer 144, a test key circuit layer 150 is located on the dielectric layer 144, wherein the test key circuit layer 150 is in a square wave pattern when viewed from a top view, and two contact pads P1 and P2 are respectively connected with two ends of the test key circuit layer 150.

In some embodiments of the present invention, the distance between a bottom surface of the test key circuit layer 150 and a top surface of the thin film resistor layer 142 is less than 500 angstroms along a vertical direction. In other words, according to the applicant's experimental results, when the vertical distance between the test key circuit layer 150 and the thin film resistor layer 142 is less than 500 angstroms, it is more likely that the thin film resistor layer will be burnt out due to the induced electric field, so it is necessary to test by using the semiconductor test key structure provided by the present invention.

In some embodiments of the present invention, only the dielectric layer 144 is included between the test key circuit layer 150 and any thin film resistor layer 142 along a vertical direction, and no other elements are included between the test key circuit layer 150 and any thin film resistor layer 142 along a vertical direction.

In some embodiments of the present invention, the square wave test key circuit layer 150 includes a plurality of strip patterns 150A and a plurality of connection patterns 150B, wherein each strip pattern 150A is arranged along a first direction (e.g., Y axis direction), and each connection pattern 150B is arranged along a second direction (e.g., X axis direction), and each connection pattern 150B is connected in series with a respective head end of two adjacent strip patterns 150A or a respective tail end of two adjacent strip patterns 150A, so that the plurality of strip patterns 150A and the plurality of connection patterns 150B form a continuous square wave pattern.

In some embodiments of the present invention, the distance P in the second direction from a right side of any one strip pattern 150A to a right side of another adjacent strip pattern is greater than 100 nm.

In some embodiments of the present invention, when viewed from a top view (FIG. 4), any thin film resistor layer 142 of the plurality of thin film resistor layers 142 is rectangular, and a long side L along the first direction (Y direction) is greater than 640 nm, and a short side W along the second direction (X direction) is greater than 100 nm.

In some embodiments of the present invention, a low voltage device region LV, a medium voltage device region MV and a high voltage device region HV are defined on the substrate 100, and a plurality of gate structures include a low voltage gate structure 112A located in the low voltage device region LV, a medium voltage gate structure 112B located in the medium voltage device region MV and a high voltage gate structure 112C located in the high voltage device region HV.

In some embodiments of the present invention, the plurality of thin film resistor layers 142 include a low voltage thin film resistor layer 142A located on the low voltage gate structure 112A, a medium voltage thin film resistor layer 142B located on the medium voltage gate structure 112B, and a high voltage thin film resistor layer 142C located on the high voltage gate structure 112C.

In some embodiments of the present invention, the test key circuit layer 150 spans the low voltage device region LV, the medium voltage device region MV and the high voltage device region HV.

The invention also provides a method for testing a semiconductor test key structure, which comprises the following steps: providing a substrate 100, forming a plurality of gate structures (including a low voltage gate structure 112A, a medium voltage gate structure 112B and a high voltage gate structure 112C) on the substrate 100, and forming a plurality of thin film resistor layers 142, wherein each thin film resistor layer 142 is located above one of the plurality of gate structures, and a plurality of thin film resistor layers 142 are located in a dielectric layer 144, forming a test key circuit layer 150, which is located on the dielectric layer 144, wherein from a top view, the test key circuit layer 150 is in a square wave pattern, and two contact pads P1 and P2 are formed, which are respectively connected with both ends of the test key circuit layer 150, and a voltage is applied to the two contact pads P1 and P2, and the voltage is gradually increased, so as to observe whether the thin film resistor layer 142 generates a burning phenomenon.

The invention is characterized in that due to miniaturization of electronic components, various electronic components are arranged more closely in a limited space. In some structures, a high voltage device region (including electronic components suitable for high voltage disposed within), a medium voltage device region (including electronic components suitable for medium voltage disposed within) and a low voltage device region (including electronic components suitable for low voltage disposed within) may be arranged adjacent to each other, and in order to effectively use space, a thin-film resistance layer is often formed above the transistor, that is, the thin-film resistance layer is inserted between the transistor and the first conductive layer (i.e., the first lateral conductive layer above the transistor). In the current technology, the distance between the thin film resistor layer and the first conductive layer may be small (about 500 angstroms), and when the first conductive layer is electrified, it will generate an electric field, and due to the electric field coupling and electric field breakdown effect, the electric field may penetrate through the dielectric layer and affect the thin film resistor layer below, even when the electric field intensity is high, it will cause the damage of the thin film resistor. Therefore, in the embodiment of the present invention, a test key structure is proposed, in which a low voltage device region, a medium voltage device region and a high voltage device region in a semiconductor device are arranged adjacent to each other, wherein each region is provided with a transistor and a thin film resistor layer, and then a test key circuit layer is designed above the thin film resistor layer. The test key circuit layer can be designed as a square wave shape to improve the arrangement density and increase the generated electric field to control and simulate the actual electric field. The invention can test the voltage tolerance of the underlying thin film resistor layer by applying voltage to the test key circuit layer, and then adjust the layout parameters of the semiconductor structure, such as appropriate circuit distribution density and dielectric layer thickness. Therefore, the test key structure and test method of the invention contribute to the yield and quality of the semiconductor structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor test key structure, characterized in that:

a substrate;

a plurality of gate structures located on the substrate;

a plurality of thin film resistor layers, wherein each thin film resistor layer is vertically overlapping with one of the gate structures, and the thin film resistor layers are located in a dielectric layer;

a test key circuit layer located on the dielectric layer, wherein the test key circuit layer is a square wave pattern when viewed from a top view, wherein the square wave pattern comprises a plurality of strip patterns and a plurality of connection patterns, wherein each strip pattern is arranged along a first direction and each connection pattern is arranged along a second direction, and each connection pattern is connected in series with a respective head end of two adjacent strip patterns or a respective tail end of two adjacent strip patterns, so that the plurality of strip patterns and the plurality of connection patterns form a continuous square wave pattern; and two contact pads, which are respectively connected with two ends of the test key circuit layer.

2. The semiconductor test key structure according to claim 1, wherein a distance from a bottom surface of the test key circuit layer to a top surface of any one of the plurality of thin film resistor layers is less than 500 angstroms along a vertical direction.

3. The semiconductor test key structure according to claim 1, wherein only the dielectric layer is included between the test key circuit layer and any thin film resistor layer along a vertical direction, and no other elements are included between the test key circuit layer and any thin film resistor layer.

4. The semiconductor test key structure according to claim 1, wherein the distance between a right side of any one of the strip patterns and a right side of another adjacent strip pattern of the strip patterns in the second direction is greater than 100 nm.

5. The semiconductor test key structure according to claim 1, wherein any one of the plurality of thin film resistor layers is rectangular when viewed from a top view, and a long side along the first direction is greater than 640 nm, and a short side along the second direction is greater than 100 nm.

6. The semiconductor test key structure according to claim 1, wherein a low voltage device region, a medium voltage device region and a high voltage device region are defined on the substrate, and the plurality of gate structures include a low voltage gate structure located in the low voltage device region, a medium voltage gate structure located in the medium voltage device region, and a high voltage gate structure located in the high voltage device region.

7. The semiconductor test key structure according to claim 6, wherein the thin film resistor layers include a low voltage thin film resistor layer located on the low voltage gate structure, a medium voltage thin film resistor layer located on the medium voltage gate structure, and a high voltage thin film resistor layer located on the high voltage gate structure.

8. The semiconductor test key structure according to claim 6, wherein the test key circuit layer spans the low voltage device region, the medium voltage device region and the high voltage device region.

9. A method for testing a semiconductor structure, characterized in that:

providing a substrate;

forming a plurality of gate structures on the substrate;

forming a plurality of thin film resistor layers, wherein each thin film resistor layer is vertically overlapping with one of the gate structures, and the thin film resistor layers are positioned in a dielectric layer;

forming a test key circuit layer on the dielectric layer, wherein the test key circuit layer is a square wave pattern when viewed from a top view, wherein the square wave pattern comprises a plurality of strip patterns and a plurality of connection patterns, wherein each strip pattern is arranged along a first direction and each connection pattern is arranged along a second direction, and each connection pattern is connected in series with a respective head end of two adjacent strip patterns or a respective tail end of two adjacent strip patterns, so that the plurality of strip patterns and the plurality of connection patterns form a continuous square wave pattern;

forming two contact pads which are respectively connected with two ends of the test key circuit layer;

applying a voltage to the two contact pads and gradually increasing the voltage; and observing whether any one of the plurality of thin film resistor layers exhibits an increase in resistance representing an open circuit condition.

10. The test method of semiconductor structure according to claim 9, wherein a distance from a bottom surface of the test key circuit layer to a top surface of any one of the plurality of thin film resistor layer is less than 500 angstroms along a vertical direction.

11. The test method of semiconductor structure according to claim 9, wherein only the dielectric layer is included between the test key circuit layer and any thin film resistor layer along a vertical direction, and no other elements are included between the test key circuit layer and any thin film resistor layer.

12. The method for testing a semiconductor structure according to claim 9, wherein the distance between a right side of any one of the strip patterns and a right side of another adjacent strip pattern in the second direction is greater than 100 nm.

13. The method for testing a semiconductor structure according to claim 9, wherein when viewed from a top view, any one of the plurality of thin film resistor layers is rectangular, and a long side along the first direction is greater than 640 nm, and a short side along the second direction is greater than 100 nm.

14. The test method of semiconductor structure according to claim 9, wherein a low voltage device region, a medium voltage device region and a high voltage device region are defined on the substrate, and the plurality of gate structures include a low voltage gate structure located in the low voltage device region, a medium voltage gate structure located in the medium voltage device region and a high voltage gate structure located in the high voltage device region.

15. The test method of semiconductor structure according to claim 14, wherein the plurality of thin film resistor layers comprise a low voltage thin film resistor layer located on the low voltage gate structure, a medium voltage thin film resistor layer located on the medium voltage gate structure, and a high voltage thin film resistor layer located on the high voltage gate structure.

16. The method for testing a semiconductor structure according to claim 14, wherein the test key circuit layer spans the low voltage device region, the medium voltage device region and the high voltage device region.

* * * * *